United States Patent
Park et al.

(10) Patent No.: US 9,941,335 B2
(45) Date of Patent: Apr. 10, 2018

(54) DISPLAY DEVICE

(71) Applicant: SAMSUNG DISPLAY CO., LTD., Yongin, Gyeonggi-Do (KR)

(72) Inventors: Jae Chun Park, Cheonan-si (KR); Jeong Seok Oh, Seoul (KR); Jae Lok Cha, Hwaseong-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 138 days.

(21) Appl. No.: 14/750,631

(22) Filed: Jun. 25, 2015

(65) Prior Publication Data

US 2016/0073528 A1  Mar. 10, 2016

(30) Foreign Application Priority Data

Sep. 4, 2014  (KR) ........................ 10-2014-0117672

(51) Int. Cl.
  *H05K 1/00* (2006.01)
  *H01L 27/32* (2006.01)
  *H01L 51/52* (2006.01)

(52) U.S. Cl.
  CPC .......... *H01L 27/323* (2013.01); *H01L 51/529* (2013.01)

(58) Field of Classification Search
  CPC ...... G02F 1/3452; H05K 1/118; H05K 1/189; H05K 1/0393; H05K 1/028
  USPC ................ 361/749–750, 782–784, 760–767; 174/250–258; 349/53–58, 149–150
  See application file for complete search history.

(56) References Cited

U.S. PATENT DOCUMENTS

| | | | | |
|---|---|---|---|---|
| RE37,945 E | * | 12/2002 | Kanezawa | G02F 1/1339 349/149 |
| 7,119,285 B2 | * | 10/2006 | Kim | H05K 1/028 174/254 |
| 7,629,538 B2 | * | 12/2009 | Heisen | H05K 1/028 174/254 |
| 7,760,284 B2 | * | 7/2010 | Murase | G02F 1/13452 257/88 |
| 8,072,765 B2 | * | 12/2011 | Yumoto | G02F 1/13452 361/749 |
| 8,102,659 B2 | * | 1/2012 | Yeon | G02F 1/13452 349/150 |
| 8,559,192 B2 | * | 10/2013 | Murakata | G06F 1/1601 345/905 |
| 8,905,635 B2 | * | 12/2014 | Clark | G01K 1/16 356/459 |
| 2002/0149074 A1 | * | 10/2002 | Imaeda | G02F 1/13452 257/432 |
| 2006/0097364 A1 | * | 5/2006 | Shinojima | G02F 1/13452 257/666 |

(Continued)

FOREIGN PATENT DOCUMENTS

KR  1020050064861  6/2005
KR  1020070091925  9/2007

(Continued)

*Primary Examiner* — Tuan T Dinh

(74) *Attorney, Agent, or Firm* — F. Chau & Associates, LLC

(57) ABSTRACT

A display device is provided. A display panel includes a display area and a pad area. A connector is connected to the pad area. A PCB is connected to the connector. A filling member is disposed between a side surface of the display panel and the connector.

17 Claims, 3 Drawing Sheets

(56) References Cited

U.S. PATENT DOCUMENTS

2011/0187965 A1* 8/2011 Ooishi .................... G09F 13/04
349/62
2013/0010411 A1* 1/2013 Wu .......................... G09F 9/30
361/679.01

FOREIGN PATENT DOCUMENTS

| KR | 1020140046898 | 4/2014 |
| KR | 1020140055607 | 5/2014 |

* cited by examiner

DISPLAY DEVICE

CROSS-REFERENCE TO RELATED APPLICATION

This application claims priority under 35 U.S.C. § 119 to Korean Patent Application No. 10-2014-0117672, filed on Sep. 4, 2014 in the Korean Intellectual Property Office, the disclosure of which is incorporated by reference herein in its entirety.

TECHNICAL FIELD

The present invention relates to a display device and a fabrication method thereof.

DISCUSSION OF RELATED ART

Organic light emitting displays may emit light based on a recombination of electrons and holes injected from an anode and a cathode in a light emitting unit, thereby capable of displaying colors. The organic light emitting displays may have a laminated structure where a light emitting layer is disposed between a pixel electrode serving as the anode and a counter electrode serving as the cathode.

Various components are necessary to operate the organic light emitting displays. Such components may be connected to each other using connectors. As the thickness of the organic light emitting display is reduced, reliable connectors are required.

SUMMARY

According to an exemplary embodiment of the present invention, a display device is provided. A display panel includes a display area and a pad area. A connector is connected to the pad area. A PCB is connected to the connector. A filling member is disposed between a side surface of the display panel and the connector.

According to an exemplary embodiment of the present invention, a display device is provided.

A pad is disposed on a first surface of the first substrate. A PCB is disposed on a second surface which is opposite to the first surface. A connector connects the PCB to the pad. The connector has a bent portion. The bent portion is spaced apart from a side surface of the first substrate. A space is disposed between the connector and the side surface of the first substrate. A filling member is disposed between the side surface and the bent portion. The filling member fills the space.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
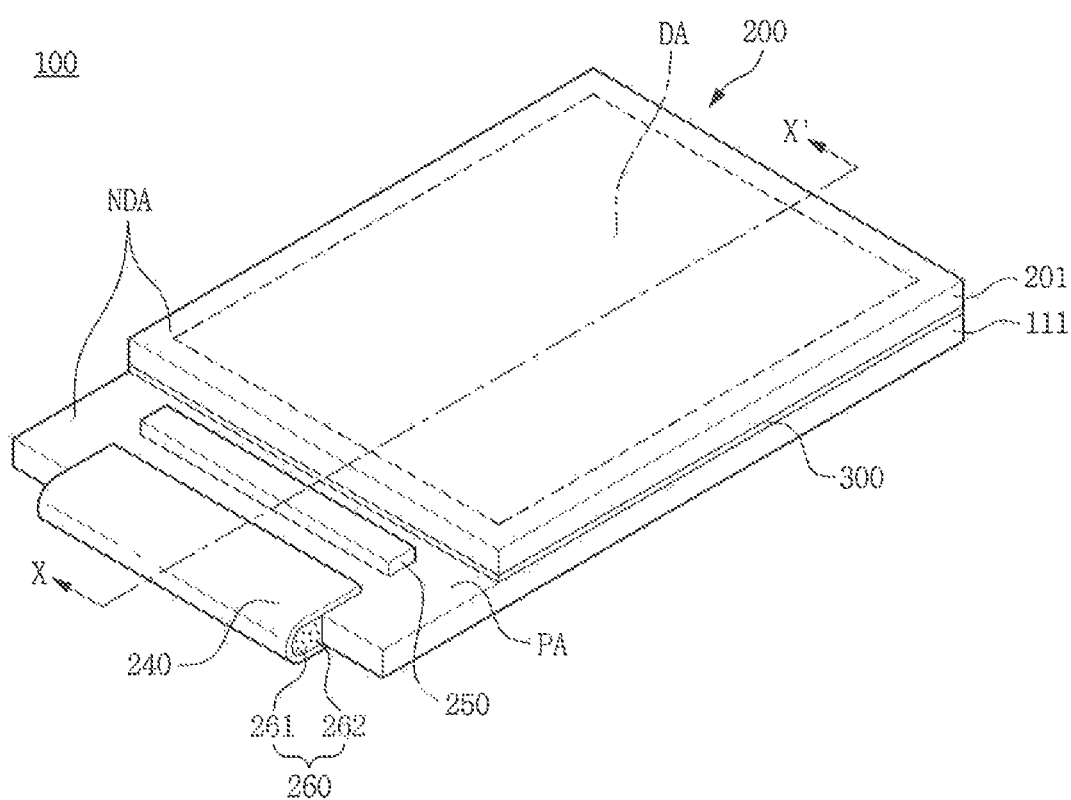
FIG. 1 is a schematic plan view illustrating a display device according to an exemplary embodiment of the present invention.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinafter, a display device according to an exemplary embodiment of the present invention will be described with reference to FIGS. 1 and 2. It is assumed that the display device includes an organic light emitting display.

FIG. 1 is a schematic plan view illustrating a display device according to an exemplary embodiment of the present invention. FIG. 2 is a schematic cross-sectional view taken along line X-X' of FIG. 1 according to an exemplary embodiment of the present invention.

Figure 2:
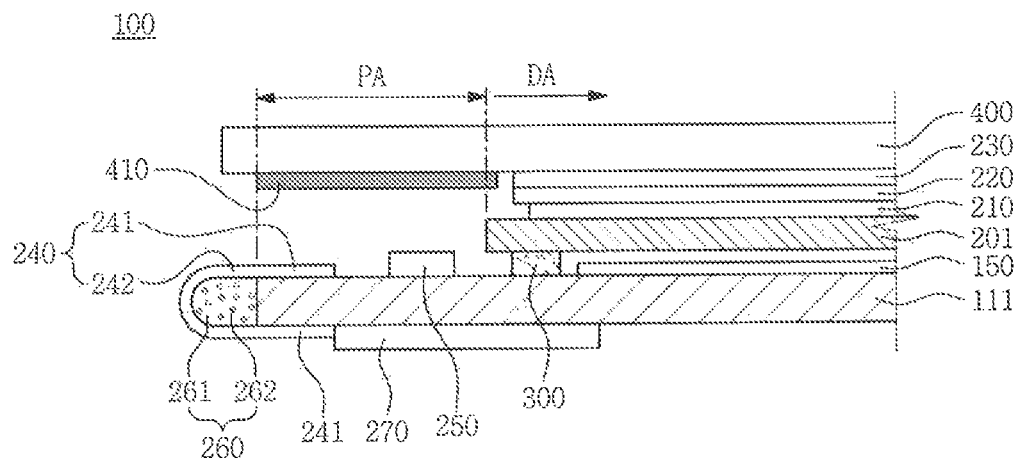
FIG. 2 is a schematic cross-sectional view taken along line X-X' of FIG. 1 according to an exemplary embodiment of the present invention.

Referring to FIGS. 1 and 2, the organic light emitting display 100 includes a display panel 200, a connector 240, a print circuit board (PCB) 270, a driving chip 250, a window 400, and a black matrix 410.

The display panel 200 displays. For example, the display panel 200 may include an LCD panel, an electrophoretic display panel, an organic light emitting diode (OLED) panel, a light emitting display (LED) panel, an inorganic electro luminescent (EL) display panel, a field emission display (FED) panel, a surface conduction electron-emitter display (SED) panel, a plasma display panel (PDP), or a cathode ray tube (CRT) display panel. However, the above are just illustrative examples and display panels of any future development may be used as the display panel 200 according to an exemplary embodiment.

The display panel 200 includes a first substrate 111, a second substrate 201 disposed to face the first substrate 111, a display unit 150, a sealant 300, a touch unit 210, and a polarizer 220. The present invention is not limited thereto. For example, the first substrate 111 may be encapsulated by an encapsulation film or the like in place of the second substrate 201.

The first substrate 111 includes a display area DA for displaying an image by light emission and a non-display area NDA disposed at an outline of the display area DA. A plurality of pixels is formed on the display area DA of the first substrate 111 to display an image. The display unit 150 is disposed on the display area DA.

The non-display area NDA includes a pad area PA on which a plurality of pad electrodes (not illustrated) are formed. The pad electrodes may receive an external signal that allows OLEDs to perform light emission and transmit the signal to the OLEDs. One or more driving chips 250 may be formed on the pad area PA.

The first substrate 111 may be formed of transparent glass materials including silicon oxide SiO2. The first substrate 111 is not limited thereto and thus may be formed of transparent plastic materials.

The driving chip 250 may include a scan driver (not illustrated) and a data driver (not illustrated) for driving the pixels. Further, the first substrate 111 may further include pad electrodes (not illustrated) on the pad area PA. The driving chip 250 may be mounted on the pad area PA of the first substrate 111 in a chip on glass (COG) structure, thereby electrically connected to the pad electrode (not illustrated). The driving chip 250 may generate scan and data signals in response to driving power and signals supplied via the PCB 270. The scan and data signals may be supplied to gate and data lines of the display area DA through the pad electrodes.

Meanwhile, the driving chip 250 need not be necessarily formed on the non-display area NDA, and thus may be omitted. Further, the driving chip 250 may be mounted on the connector 240 having a chip on film structure. For example, a tape carrier package (TCP) where the driving chip 250 is mounted on the connector 240 having a chip on film structure may be applied to the organic light emitting display 100.

A pad (not illustrated) configured to protect the driving chip 250 from external shock may be further disposed on the pad area PA. The driving chip 250 may be an integrated circuit (IC), such as a driving IC.

The display unit 150 is formed on the first substrate 111 and connected to the driving chip 250. The display unit 150 may include an OLED, a thin film transistor (TFT) and a line for driving the OLED. The display unit 150 will be described below with reference to FIGS. 3 and 4. Any elements, other than the OLED, applicable to the display device may form the display unit 150.

The second substrate 201 is disposed to face the first substrate 111 and bonded to the first substrate 111 using the sealant 300. The second substrate 201 covers the display unit 150 for protection. The second substrate 201 may be formed of a glass substrate, a transparent synthetic resin film such as acrylic, or a metal plate. For example, the second substrate 201 may be formed of one of a polyethylene (PET) film, a polypropylene (PP) film, a polyamide (PA) film, a polyacetal (POM) film, a poly methyl methacrylate (PMMA) film, a polybutylene terephthalate (PBT) film, a polycarbonate (PC) film, a cellulose film, and moisture-proof cellophane.

The second substrate 201 has a smaller size than the first substrate 111. The second substrate 201 does not cover the first substrate 111. Accordingly, the pad unit PA of the first substrate 111 is exposed by the second substrate 201.

The sealant 300 may include sealing glass frit.

The touch unit 210 is disposed on the display area DA of the first substrate 111. For example, the touch unit 210 is disposed on the second substrate 201 which is disposed in the display area DA of the first substrate 111. The touch unit 210 may include first and second electrodes (not illustrated) intersecting each other. The first and second electrodes may be directly patterned on the second substrate 201 respectively in a plurality of columns in a matrix form into an on-cell type. The first and second electrodes may correspond to a touch sensor pattern. Further, the touch unit 210 may be disposed on the second substrate 201 as a separately manufactured touch panel.

The touch unit 210 may detect a touch input by a touch means such as a pen or a user's finger and transmit a signal corresponding to a touched location to a touch driver (not illustrated). The touch unit 210 may be used as an input means of the organic light emitting display 100 and formed as a resistive type or a capacitive type.

The window 400 may be formed of a transparent material, such as glass and resins, and configured to protect the display panel 200 not to be broken by external shock. For example, the window 400 is disposed on the touch unit 210 and cover the display and pad areas DA and PA. The window 400 may be bonded to the second substrate 201 using an adhesive layer 230. The window 400 is larger compared to the display panel 200, but is not limited thereto. For example, the window 400 may be formed to have substantially the same size as the display panel 200.

The black matrix 410 is disposed on the window 400 area in the pad area PA. The black matrix 410 may include a printing material that may prevent the pattern disposed under the window 400 from being seen. The printing material may be formed of a black printing material. The present invention is not limited thereto, and the printing material may include at least one of various colors. Meanwhile, the black matrix 410 may include a light absorbing material such as chromium (Cr).

The polarizer 220 may be disposed between the window 400 and the touch unit 210. The polarizer 220 may prevent ambient light reflection.

The adhesive layer 230 is disposed between the window 400 and the touch unit 210 and configured to increase luminance, transmittance, reflectivity, and visibility of the organic light emitting display 100. The adhesive layer 230 may serve to prevent formation of an air gap between the window 400 and the second substrate 200 and infiltration of undesired materials such as dust. The adhesive layer 230 may include a resin. The resin may include a photopolymer resin.

The PCB 270 may be a circuit board configured to supply a driving signal to the display panel 200. The PCB 270 may include a timing controller (not illustrated) for generating a control signal for driving the display panel 200 and a power generator (not illustrated) configured to generate an electric power.

The PCB 270 is disposed on one surface of the display panel 200. For example, the PCB 270 is disposed on a bottom surface of the display panel 200. The display panel 200 may display an image on a top surface thereof, and therefore the bottom surface thereof may be an area which is not seen to a user. Accordingly, to increase space efficiency and hide an unnecessarily visible structure, the PCB 270 is disposed on the bottom surface of the display panel 200. The present invention is not limited thereto, and the PCB 270 may be disposed on a side surface of the display panel 200. In this case, the PCB and FPCB may be integrally formed.

The PCB 270 is electrically connected to the display panel 200 to supply the driving signal to the display panel 200 using a connector 240.

The connector 240 is connected to the pad area PA of the display panel 200. Since electrically connected to the display panel 200 and the PCB 270, the connector 240 electrically connects the display panel 200 and the PCB 270. The connector 240 may be in a form of an FPCB. The connector 240 may be formed of a chip on film or a tape carrier package including an IC chip. The connector 240 includes an overlapping portion 241 in contact with the pad area PA of the display panel 200 and a bent portion 242 bent along the side surface of the display panel 200. For example, as illustrated in FIG. 2, the connector 240 may include the overlapping portion 241 in contact with the pad area PA of the first substrate 111 and the bent portion 242 bent along a side surface of the first substrate 111.

One end portion of the connector 240 is electrically connected to the display panel 200 and the other end portion of the connector 240 is electrically connected to the PCB 270. The display panel 200 and the PCB 270 are electrically connected to each other using the inside of the connector 240.

Although not illustrated, the connector 240, when cross-sectionally viewed, may include a base film and a line pattern disposed on the base film. The connector 240 may further include a cover film disposed on the line pattern.

The base and cover films may be formed of a film having flexibility such that the connector 240 is bent along the side surface of the display panel 200. The base and cover film may be formed of a film having insulating and heat-resistant properties. For example, the base and cover films may include, such as polyimides, but are not limited thereto.

The line pattern may be disposed between the base and cover films. The line pattern may be configured to transmit a predetermined electric signal and formed of metal, such as copper (Cu). The copper may be plated with, for example, tin, silver, or nickel. The line pattern may be formed by, for example, casting, laminating, and electroplating. Further, other methods may be employed to form the line pattern.

As described above, the one end portion of the connector 240 is electrically connected to the one surface of the display panel 200 and the other end portion of the connector 240 is electrically connected to the PCB 270. The one end portion and the other end portion of the connector 240 corresponds to the overlapping portion 241. Further, the bent portion 242 is formed along the side surface of the display panel 200 between the one end portion and the other end portion of the connector 240. The bent portion 242 is bent to cover the side surface of the display panel 200.

As described above, the connector 240 includes the bent portion 242. Thus, as the organic light emitting display 100 becomes slim, a radius of curvature of the bent portion 242 may be reduced and thus stress created at the bent portion 242 may be increased. In this case, the overlapping portion 241 of the connector 240 may be loosened off from the display panel 200.

Accordingly, the organic light emitting display 100 according to an exemplary embodiment of the present invention may include a filling member 260 between the side surface of the display panel 200 and the connector 240.

For example, the filling member 260 may be disposed between the bent portion 242 of the connector 240 and the side surface of the display panel 200. As described in FIG. 2, the filling member 260 is disposed between the side surface of the first substrate 111 and the bent portion 242.

The filling member 260 may include a resin 261 and a heat dissipation member 262 dispersed in the resin 261. The resin 261 is a substance that has an adhesive property and is quickly cured by UV rays. As the resin 261 is formed on the bent portion 242 of the connector 240, adhesion between the display panel 200 and the connector 240 may be increased. Further, as the resin 261 is disposed on the bent portion 242 of the connector 240, the air gap is not formed between the display panel 200 and the connector 240. Accordingly, the resin 261 of the filling member 260 may prevent the loosening of the connector 240 so that the device strength of the organic light emitting display 100 may be increased.

The heat dissipation member 262 may serve to release heat produced from the driving chip 250 and the connector 240. The heat dissipation member 262 may include at least one of gold, silver, copper, tungsten, carbon nanotubes (CNT), graphite, and alloys thereof. The heat dissipation member 262 may be a small particle formed of copper, graphite, or the like. The heat dissipation member 262 may serve to release heat so that the resin 261 is not degraded due to heat. As the heat dissipation member 262 is dispersed in the resin 261, heat generated from the driving chip 250 may be released so that the reliability of the organic light emitting display 100 may be increased.

Meanwhile, the organic light emitting display 100 according to an exemplary embodiment of the present invention may further include a buffer member.

Figure 5:
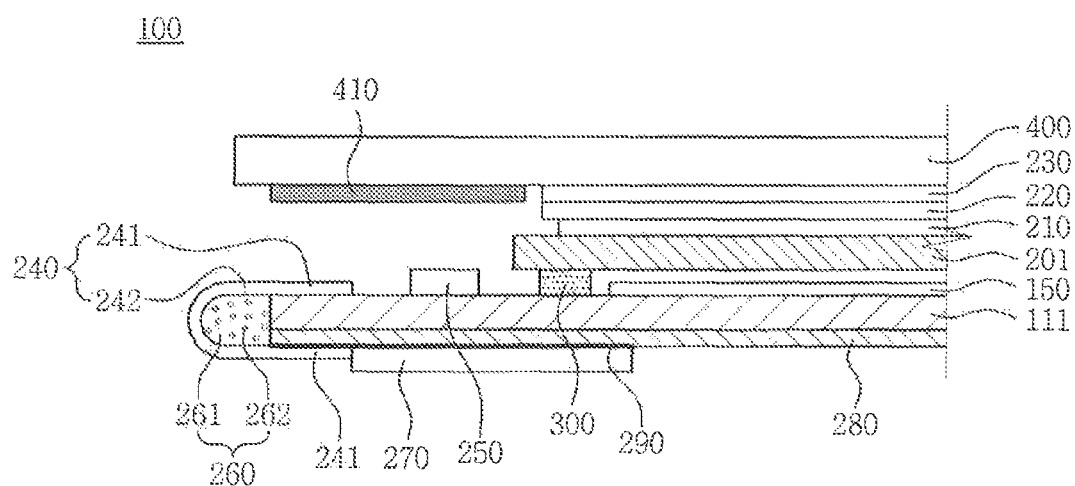
FIG. 5 is a schematic cross-sectional view taken along line X-X' of FIG. 1 according to an exemplary embodiment of the present invention.

FIG. 5 is a schematic cross-sectional view taken along line X-X' of FIG. 1 according to an exemplary embodiment of the present invention.

Referring to FIG. 5, a buffer member 280 may be disposed between the first substrate 111 and the PCB 270. The buffer member 280 may be formed of an elastic material and include, for example, rubber or a silicon-based material. The buffer member 280 may absorb shock transmitted from the outside of the organic light emitting display 100.

Meanwhile, a double-sided tape 290 is disposed between the buffer member 280 and the PCB 270. The double-sided tape 290 may serve to stably bond the PCB 270 to the buffer member 280.

Hereinafter, one pixel of the display unit 150 will be described with reference to FIGS. 3 and 4.

Figure 3:
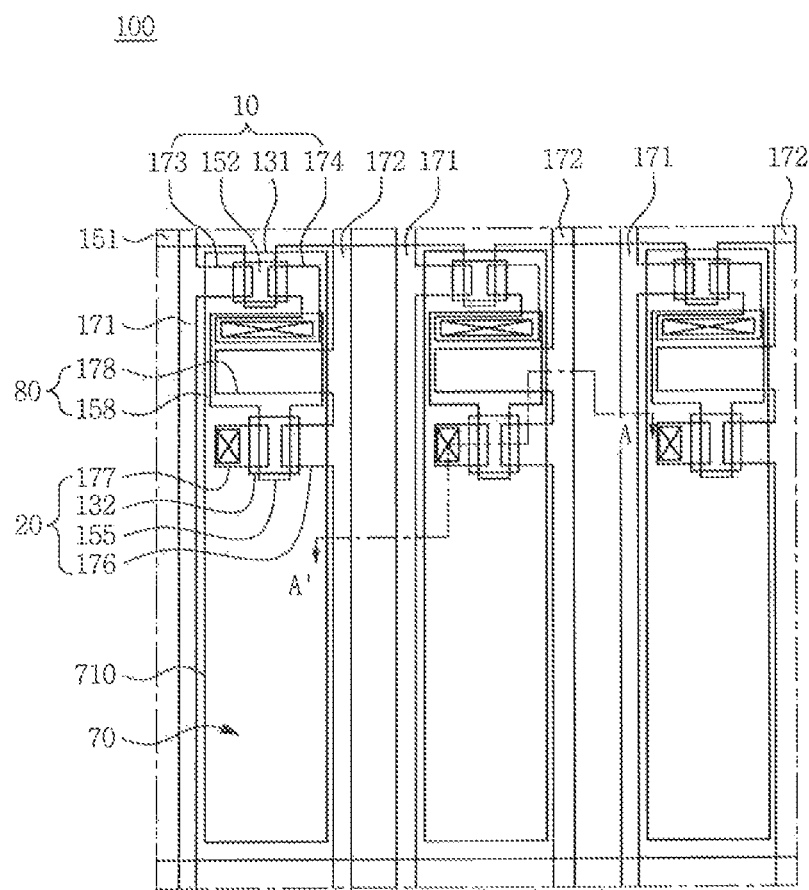
FIG. 3 is a schematic plan view illustrating one pixel of the display device.

FIG. 3 is a schematic plan view illustrating one pixel of a display device according to an exemplary embodiment of the present invention. FIG. 4 is a cross-sectional view taken along line A-A' of FIG. 3.

Figure 4:
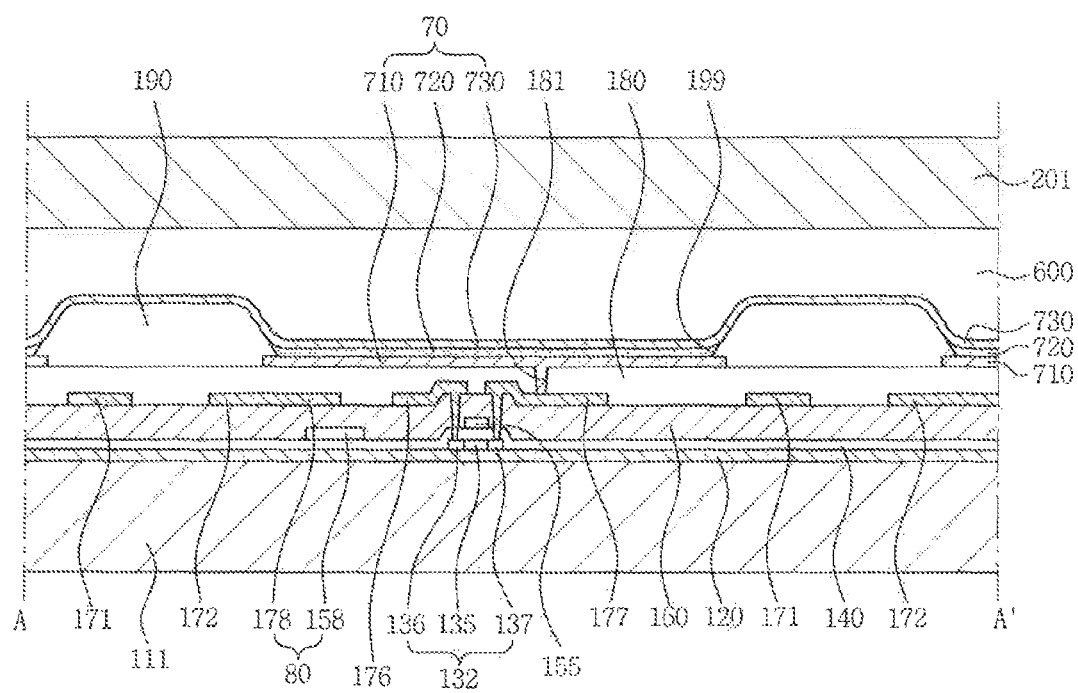
FIG. 4 is a cross-sectional view taken along line A-A' of FIG. 3.

Referring to FIGS. 3 and 4, a display area DA according to an exemplary embodiment of the present invention will be described.

FIGS. 3 and 4 illustrate an active-matrix (AM)-type organic light emitting display having a 2Tr-1Cap structure. For example, the 2Tr-1Cap structure includes two TFTs 10 and 20 and a capacitor 80 in each pixel of the display area (hereinafter DA of FIG. 1). The present invention is not limited thereto.

For example, the organic light emitting display 100 may have include three or more TFTs and two or more capacitors 80 in one pixel, and may further include additional lines. Herein, the term "pixel" refers to the smallest unit for displaying an image, and the display area displays an image using a plurality of pixels.

The organic light emitting display 100 includes the first substrate 111 and a plurality of pixels formed on the first substrate 111. Each of the plurality of pixels includes the switching TFT 10, the driving TFT 20, the capacitor 80, and an OLED 70. In addition, each pixel further includes a gate line 151 arranged along one direction and a data line 171 and a common power line 172 insulated from and intersecting the gate line 151.

Herein, each pixel may be defined by the gate, data, and common power lines 151, 171, and 172, but the present invention is not limited thereto.

The OLED 70 may include a first electrode 710, an organic light emitting layer 720 formed on the first electrode 710, and a second electrode 730 formed on the organic light emitting layer 720. Herein, one or more first electrodes 710 are formed on each pixel, and thus the first substrate 111 may include a plurality of first electrodes 710 spaced apart from each other.

Herein, the first electrode 710 may be a positive end portion (anode) serving as a hole injecting electrode and the second electrode 730 may be a negative end portion (cathode) serving as an electron injecting electrode. However, the present invention is not limited thereto, and the first electrode 710 may function as a cathode, and the second electrode 730 may function as an anode according to a method of driving the organic light emitting display. Further, the first electrode 710 may be a pixel electrode and the second electrode 730 may be a common electrode.

A hole and an electron injected to the organic light emitting layer 720 are combined with each other to form an exciton, and the organic light emitting display may emit light by energy generated when the exciton falls from an excited state to a ground state.

The capacitor 80 includes a pair of storage electrodes 158 and 178 with an insulating layer 160 interposed therebetween. Herein, the insulating layer 160 may include a dielectric material. Capacitance of the capacitor 80 is determined by electric charges stored in the capacitor 80 and voltage across the pair of storage electrodes 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 may function as a switching element which selects a pixel to perform light emission. The switching gate electrode 152 is connected to the gate line 151, and the switching source electrode 173 is connected to the data line 171. The switching drain electrode 174 is spaced apart from the switching source electrode 173 and connected to the first storage electrode 158.

The driving TFT 20 may apply a driving power to the first electrode 710, which allows the light emitting layer 720 of the OLED 70 in a selected pixel to emit light. The driving gate electrode 155 is connected to the first storage electrode 158 that is connected to the switching drain electrode 174. The driving source electrode 176 and the second storage electrode 178 are respectively connected to the common power line 172.

The driving drain electrode 177 is connected to the first electrode 710 of the OLED 70 through a drain contact hole 181.

With the above-described structure, the switching TFT 10 may be operated by a gate voltage applied to the gate line 151 and may function to transmit a data voltage applied to the data line 171 to the driving TFT 20.

Voltage equivalent to a difference between a common voltage applied from the common power line 172 to the driving TFT 20 and the data voltage transmitted from the switching TFT 10 may be stored in the capacitor 80, and current corresponding to the voltage stored in the capacitor 80 may flow to the OLED 70 through the driving TFT 20, so that the OLED 70 may emit light.

A structure of the organic light emitting display 100 according to an exemplary embodiment will be described in more detail with reference to FIGS. 2-4.

The OLED display 70, the driving TFT 20, the capacitor 80, the data line 171, and the common power line 172 illustrated in FIG. 3 will be described. Further, a switching semiconductor layer 131, a switching gate electrode 152, switching source and drain electrodes 173 and 174 of the switching TFT 10 may have the same laminated structure as the driving semiconductor layer 132, the driving gate electrode 155, the driving source and drain electrodes 176 and 177 of the driving TFT 20, and thus the repeated description will not be provided.

According to an exemplary embodiment of the present invention, the first substrate 111 may be formed of an insulating substrate formed of glass, quartz, ceramic, plastic or the like. However, the present invention is not limited thereto, and the first substrate 111 may be formed of a metal substrate including stainless steel or the like.

A buffer layer 120 is formed on the first substrate 111. The buffer layer 120 may reduce or prevent infiltration of undesirable elements and planarize a surface, and may include various materials in accordance therewith. For instance, the buffer layer 120 may be formed of at least one a silicon nitride (SiNx), a silicon oxide (SiO2), and a silicon oxynitride (SiOxNy). However, the buffer layer 120 may be omitted according to the kind of the first substrate 111 and process conditions thereof.

The driving semiconductor layer 132 is formed on the buffer layer 120. The driving semiconductor layer 132 may include at least one semiconductor material selected from a group of polycrystalline silicon, amorphous silicon, and oxide semiconductors. Further, the driving semiconductor layer 132 includes a channel region 135 that is not doped with impurities and p+ doped source and drain regions 136 and 137 that are formed on both sides of the channel region 135. In this case, p-type impurities, such as boron B, may be doped using, for example, $B_2H_6$. Such impurities may vary depending on the kinds of the TFTs.

A gate insulating layer 140 formed of a silicon nitride or a silicon oxide is formed on the driving semiconductor layer 132. The gate insulating layer 140 may include at least one of tetra ethyl ortho silicate (TEOS), a silicon nitride (SiNx), and a silicon oxide (SiO2). In some embodiments, the gate insulating layer 140 may have a double-layer structure where a SiNx layer having a thickness of about 40 nm and a TEOS layer having a thickness of 80 nm are sequentially laminated, for example. However, the present invention is not limited thereto.

The driving gate electrode 155, the gate line (reference number 151 of FIG. 1), and the first storage electrode 158 are formed on the gate insulating layer 140. In this case, the driving gate electrode 155 is formed to overlap at least a part of the driving semiconductor layer 132. For example, the driving gate electrode 155 overlaps the channel region 135. The driving gate electrode 155 may serve to prevent the channel region 135 from being doped with impurities when the source and drain regions 136 and 137 of the driving semiconductor layer 132 are doped with the impurities in the forming of the driving semiconductor layer 132.

The gate electrode 155 and the first storage electrode 158 may be formed using the same layer, and may include substantially the same metal material. In this case, the metal material may include at least one of molybdenum (Mo), chromium (Cr), and tungsten (W). In some embodiments, the gate electrode 155 and the first storage electrode 158 may include molybdenum (Mo) or molybdenum alloys.

The insulating layer 160, covering the driving gate electrode 155, is formed on the gate insulating layer 140. The insulating layer 160 may be an interlayer insulating layer. The insulating layer 160 may be formed of a silicon nitride (SiNx) or a silicon oxide (SiOx) which is substantially similar to the gate insulating layer 140. The gate insulating layer 140 and the insulating layer 160 may have a contact hole to expose the source and drain regions 136 and 137 of the driving semiconductor layer 132.

The driving source and drain electrodes 176 and 177, the data line 171, the common power line 172, the second storage electrode 178 are disposed on the insulating layer 160 of the display area DA. The driving source and drain electrodes 176 and 177 are respectively connected to the source and drain regions 136 and 137 of the driving semiconductor layer 132 through the contact hole.

For example, the driving source and drain electrodes 176 and 177, the data line 171, the common power line 172, and the second storage electrode 178 may be formed of refractory metal including at least one of molybdenum, chromium, tantalum, titanium and metal alloys thereof and may have a multi-layer structure including a refractory metal film and a low-resistance conductive film. The multi-layer structure may include a double-layer structure including a chromium or molybdenum (alloy) lower film and an aluminum (alloy) upper film or a triple-layer structure including a molybdenum (alloy) lower film, an aluminum (alloy) middle film, and a molybdenum (alloy) upper film.

The present invention is not limited thereto. For example, the driving source and drain electrodes 176 and 177, the data line 171, the common power line 172, and the second storage electrode 178 may be formed of various conductive materials other than the above-described materials.

Accordingly, the driving thin film transistor 20 may be formed including the driving semiconductor layer 132, the driving gate electrode 155, and the driving source and drain electrodes 176 and 177. However, the present invention is not limited thereto, and the driving thin film transistor 200 may have various structures.

A protective layer 180 is formed on the insulating layer 160 to cover the driving source and drain electrodes 176 and 177, and the like. The protective layer 180 may be formed of organic materials, such as polyacrylates and polyimides. The protective layer 180 may be a planarizing layer which provides a planarized surface for the subsequent processes.

The protective layer 180 may be formed of at least one of polyacrylate resins, epoxy resins, phenolic resins, polyamide resins, polyimide reins, unsaturated polyester resins, polyphenylenether resins, poly-phenylenesulfide resins, and benzocyclobutene (BCB).

The protective layer 180 may have the drain contact hole 181 to expose the driving drain electrode 177.

The first electrode 710 is formed on the protective layer 180 and connected to the driving drain electrode 177 through the drain contact hole 181 of the protective layer 180.

A pixel defining layer 190 is formed on the protective layer 180 and covers the first electrode 710. The pixel defining layer 190 includes an opening 199 to expose the first electrode 710.

For example, the first electrode 710 is disposed in the opening 199 of the pixel defining layer 190. The pixel defining layer 190 may be formed of resins, such as polyacrylate resins and polyimide resins.

Further, the pixel defining layer 190 may be formed of a photosensitive organic material or a photosensitive polymer material. For example, the pixel defining layer 190 may be formed of one of polyacrylates, polyimides, photo sensitive polyimides (PSPI), photosensitive acryl (PA), and photosensitive novolak resins.

The organic light emitting layer 720 is formed on the first electrode 710 in the opening 199 of the pixel defining layer 190, and the second electrode 730 is formed on the pixel defining layer 190 and the organic light emitting layer 720.

Accordingly, the OLED 70 includes the first electrode 710, the organic light emitting layer 720, and the second electrode 730.

One of the first and second electrodes 710 and 730 may be formed of a transparent conductive material and the other thereof may be formed of a transflective or reflective conductive material. Depending on the material of the first and second electrodes 710 and 730, the organic light emitting display device 100 may become a top-emission type, a bottom-emission type, or a both-side-emission type.

For example, when the organic light emitting display device 100 according to an exemplary embodiment is provided in the top-emission type, the first electrode 710 may be formed of the transflective or reflective conductive material and the second electrode 730 may be formed of the transparent conductive material.

At least one of indium tin oxides (ITO), indium zinc oxides (IZO), zinc oxides (ZnO), and indium oxides (In2O3) may be used as the transparent conductive material. At least one of lithium (Li), calcium (Ca), lithium fluoride/calcium (LiF/Ca), lithium fluoride/aluminum (LiF/Al), aluminum (Al), silver (Ag), magnesium (Mg), and gold (Au) may be used as the reflective material.

The organic light emitting layer 720 may be formed of low molecular weight organic materials or high molecular weight organic materials. The organic light emitting layer 720 may have a multi-layer structure including a light emitting layer and at least one of a hole injection layer (HIL), a hole transporting layer (HTL), an electron transporting layer (ETL) and an electron injection layer (EIL). In some embodiments, the HIL may be disposed on the first electrode 710 that is a positive end portion and the HTL, light emitting layer, ETL, and EIL may be sequentially laminated thereon.

According to an exemplary embodiment of the present invention, the organic light emitting layer 720 is formed only in the opening 199 of the pixel defining layer 190, but the present invention is not limited thereto. For example, at least one layer of the organic light emitting layer 720 may be disposed not only on the first electrode 710 but also between the pixel defining layer 190 and the second electrode 730 inside the opening 199 of the pixel defining layer 190. For example, HIL, HTL, ETL, EIL, and the like of the organic light emitting layer 720 may be formed on an area other than the opening 199 using an open mask, and the light emitting layer of the organic light emitting layer 720 may be formed on each opening 199 using a fine metal mask (FMM).

Meanwhile, when the LCD display is used as an exemplary embodiment of the present invention, the first electrode 710 may be physically and electrically connected to the driving drain electrode 177 through the drain contact hole 181 and applied with a data voltage from the driving drain electrode 177. The first electrode 710 applied with the data voltage may form an electric field with the second electrode (common electrode, not illustrated) applied with a common voltage, which determines a direction of the liquid crystal molecules of the liquid crystal layer (not illustrated) between the two electrodes. The first electrode 710 and the second electrode may form a capacitor (hereinafter "a liquid crystal capacitor"), which may maintain an applied voltage although the thin film transistor is turned off.

The second substrate 201 may be bonded to the first substrate 111 to seal the OLED 70 interposed therebetween. The second substrate 201 may cover and protect the TFTs 10 and 20 and the OLED 70 formed on the first substrate 111 to be sealed from the outside. An insulating substrate generally formed of glass or plastic may be used as the second substrate 201. When the organic light emitting display 100 is provided in the top-emission type where an image is displayed toward the second substrate 201, the second substrate 201 may be formed of a light-transmissive material.

Meanwhile, a buffer member 600 is disposed between the first and second substrates 111 and 201. The buffer member 600 may protect inner elements such as the OLED 70 from shock transmitted from the outside of the organic light emitting display 100. The buffer member 600 may increase device reliability of the organic light emitting display 100. The buffer member 600 may include at least one of an organic sealant, such as urethane-based resin, an epoxy-based resin, and an acrylic resin, and an inorganic sealant, such as silicon. An urethane acrylate, for example, may be used as the urethane-based resin. A butyl acrylate and an ethylhexyl acrylate, for example, may be used as the acrylic resin.

While the present invention has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A display device comprising:
    a display panel comprising a display area and a pad area;
    a connector connected to the pad area;
    a PCB connected to the connector; and
    a filling member disposed between a side surface of the display panel and the connector,
    wherein the display panel includes a first surface and a second surface opposite to the first surface,
    wherein the filling member directly contacts the side surface of the display panel and fills a space between the side surface of the display panel and the connector, and
    wherein the connecter directly contacts both the first surface and the second surface of the display panel.

2. The display device of claim 1,
    wherein the connector is bent along the side surface of the display panel.

3. The display device of claim 1,
    wherein the filling member comprises a resin and a heat dissipating substance dispersed in the resin.

4. The display device of claim 1,
    wherein the connector is an FPCB.

5. The display device of claim 1,
    wherein the display panel comprises:
    a first substrate comprising a display area and a pad area; and
    a second substrate disposed to face the first substrate.

6. The display device of claim 3,
    wherein the heat dissipating substance comprises at least one of gold, silver, copper, tungsten, carbon nanotubes (CNT), graphite, and an alloy thereof.

7. The display device of claim 3,
    wherein the connector has: an overlapping portion in contact with the pad area of the display panel; and a bent portion bent along the side surface of the display panel.

8. The display device of claim 3,
    wherein the resin includes a photopolymer resin.

9. The display device of claim 5,
    wherein the connector is bent along a side surface of the first substrate.

10. The display device of claim 5,
    wherein the connector has: an overlapping portion in contact with the pad area of the first substrate; and a bent portion bent along the side surface of the first substrate.

11. The display device of claim 5, further comprising a touch unit on the second substrate.

12. The display device of claim 5,
    wherein the PCB is directly attached to the first substrate.

13. The display device of claim 7,
    wherein the filling member is disposed between the bent portion and the side surface of the display panel.

14. The display device of claim 10,
    wherein the filling member is disposed between the bent portion and the side surface of the first substrate.

15. A display device comprising:
    a display panel comprising a display area and a pad area,
    wherein the display panel comprises:
    a first substrate comprising a display area, a pad area, and a first surface and a second surface opposite the first surface, and
    a second substrate disposed to face the first substrate;
    a buffer member directly attached to the second surface of the first substrate;
    a PCB attached to the buffer member;
    a connector connecting the PCB with the pad area; and
    a filling member disposed between a side surface of the display panel and the connector,
    wherein the connect directly contacts the first surface of the first substrate and the buffer member, and
    wherein the PCB directly contacts the buffer member.

16. The display device of claim 15, further comprising a double-sided tape between the PCB and the buffer member.

17. The display device of claim 15,
    wherein the buffer member is formed of at least one of silicon nitride (SiNx), silicon oxide (SiO2), and silicon oxynitride (SiOxNy).

* * * * *